United States Patent [19]
Spence

[11] Patent Number: 5,573,890
[45] Date of Patent: Nov. 12, 1996

[54] METHOD OF OPTICAL LITHOGRAPHY USING PHASE SHIFT MASKING

[75] Inventor: Christopher A. Spence, Sunnyvale, Calif.

[73] Assignee: Advanced Micro Devices, Inc., Sunnyvale, Calif.

[21] Appl. No.: 276,734

[22] Filed: Jul. 18, 1994

[51] Int. Cl.$^6$ ........................................................ G03F 7/20
[52] U.S. Cl. ............................ 430/311; 430/394; 430/396
[58] Field of Search .................................... 430/311, 394, 430/396

[56] References Cited

U.S. PATENT DOCUMENTS

| | | | |
|---|---|---|---|
| 5,302,477 | 4/1994 | Dao | 430/314 |
| 5,308,741 | 5/1994 | Kemp | 430/396 |
| 5,328,807 | 7/1994 | Tanaka | 430/396 |
| 5,352,550 | 10/1994 | Okamoto | 430/396 |

*Primary Examiner*—Kathleen Duda
*Attorney, Agent, or Firm*—Foley & Lardner

[57] ABSTRACT

A method of performing poly level lithography in manufacturing an integrated circuit using a phase shift mask in a step and repeat optical tool where the phase assignment for said phase shift mask is determined by a technique which determines, without assignment conflict, the Intersection of the gate pattern with the active gate pattern and which divides the Intersection into categories of stacks where a slightly different phase assignment rule is employed for the different stacks.

11 Claims, 12 Drawing Sheets

LIGHT AMPLITUDE IMMEDIATELY AFTER TRANSMISSION THROUGH MASK

LIGHT AMPLITUDE ON WAFER

LIGHT INTENSITY ON WAFER

STANDARD DESIGN

GATE SHRINK

METHOD OF OPTICAL LITHOGRAPHY USING PHASE SHIFT MASKING

FIELD OF THE INVENTION

The invention relates to a field of integrated circuit manufacture using phase shift masking in the optical lithographic patterning process.

BACKGROUND OF THE INVENTION

Optical lithography has been the technique of choice employed for forming circuit patterns in integrated circuits. Typically, ultraviolet light is directed through a mask. A mask is similar in function to an "negative" which is used in ordinary photography. However, the typical mask has only fully light transmissive and fully non-transmissive regions as opposed to an ordinary negative which has various "gray" levels. In the same manner as one makes a print from a negative in ordinary photography, the pattern on the mask can be transferred to a semiconductor wafer which has been coated with a photoresist layer. An optical lens system provides focusing of the mask patterns onto the surface of the photoresist layer. The exposed photoresist layer is developed, i.e. exposed/non-exposed regions are chemically removed. The resulting photoresist pattern is then used as a mask for etching underlying regions on the wafer.

In recent years, demands to increase the number of transistors on a wafer have required decreasing the size of the features but this has introduced diffraction effects which have made it difficult to further decrease the feature size. Prior to the work of Levenson, et. al., as reported in "Improving Resolution in Photolithography with a Phase Shifting Mask," IEEE Transactions on Electron Devices, VOL., ED-29, Nov. 12, December 1982, pp. 1828–1836, it was generally thought that optical lithography would not support the increased density patterning requirements for feature sizes under 0.5 microns. At this feature size, the best resolution has demanded a maximum obtainable numerical aperture (NA) of the lens systems. However, the depth of field of the lens system is inversely proportional to the NA, and since the surface of the integrated circuit could not be optically flat, good focus could not be obtained when good resolution was obtained and it appeared that the utility of optical lithography had reached its limit. However, the Levenson paper introduced a new phase shifting concept to the art of mask making which has made use of the concepts of destructive interference to overcome the diffraction effects.

Ordinary photolithography, with diffraction effects, is illustrated in FIG. 1(a)–1(d). As the apertures P1 and P2 become closer, N becomes smaller, and as seen in FIG. 1(b), the light amplitude rays which pass through P1 and P1 start to overlap due to diffraction effects. These overlapping portions result in light intensity at the wafer, FIG. 1(d), which impinges on the photoresist layer. Accordingly, due to diffraction, the intensity of the wafer no longer has a sharp contrast resolution in the region between P1 and P2.

As illustrated by FIG. 2(a) to 2(e), it is possible to make use of the fact that light passing through the masking substrate material, FIG. 2(a), 51, (and FIG. 2(b), 51') exhibits a wave characteristic such that the phase of the amplitude of the light exiting from the mask material is a function of the distance the light ray travels in the substrate material, i.e., thickness $t_1$ and $t_2$. By making the thickness $t_2$ such that $(n-1)(t_2)$ is exactly equal to $\frac{1}{2}\lambda$, where $\lambda$ is the wavelength of the light in the mask material, and n=refractive index of the added or subtracted natural material, then the amplitude of the light existing from aperture P2 is in opposite phase from the light exiting aperture P1. This is illustrated in FIG. 2(c) showing the effects of diffraction and use of interference cancellation. The photoresist material is responsive to the intensity of the light at the wafer. Since the opposite phases of light cancel where they overlap and since intensity is proportional to the square of the resultant amplitude, as seen in FIG. 2(d), contrast resolution is returned to the pattern.

FIG. 2(a) and FIG. 2(b) illustrate two different techniques for obtaining the interference phase shifting. In FIG. 2(a), the light transverses through a longer distance via deposited layer 52. In FIG. 2(b), the light in region P2 transverses through a shorter distance by virtue of an etched groove 52' in the wafer 51'.

Phase shifting masks are now well known and there are many varieties which have been employed, as more fully set out in the article by B. J. Lin, "Phase-Shifting Masks Gain an Edge," Circuits and Devices, March 1993, pp. 28–35. The configuration of FIG. 2(a) and FIG. 2(b) have been called alternating phase shift masking (APSM). Several researchers have compared the various phase shifting techniques and have shown that the APSM approach is the only known method proven capable of achieving resolution 0.25 microns and below, with depth of field as large as ±0.34 microns with an I line stepper. Alternating PSM can be implemented in dark and light field mask versions. If the dark field strategy is employed for alternating PSM, a negative tone photoresist must be employed and if the light field version is employed, a positive photoresist must be chosen. The positive resist portion which is exposed to UV is removed during development and vice versa for negative resist.

As illustrated in FIG. 2(e), the process for making and using binary masks have been highly computerized. The designer of complex integrated circuits now works at a computer terminal and specifies a circuit design on a computer which requires compliance with certain predetermined design rules, 80. The initial design is validated using a design rule checker software 88. Accordingly, when the functional design is completed, a computer aided design tool program 81 automatically creates a digital bit map or vector file called a PG Tape 82 which represents the data in a standard and known data format for manufacturing the mask to accomplish the design. These digital files are then used to control automatic processes for manufacturing the masks, typically resulting in a magnified, e.g. 5×, physical reticle, 83, containing the mask pattern for each layer of the integrated circuit. The mask is then typically installed in a wafer stepper (a step and repeat optical tool) 84, which automatically carries out the lithographic exposure repeatedly on the wafer 87 by exposing the photoresist layer 85 at a physical location and moving the wafer, i.e. stepping, and repeating the same exposure at an adjoining location.

To date, due to various difficulties, alternating phase shifting masks have not generally been able to be designed automatically by the mask creation programs. This has required mask designers to expend time consuming and tedious manual analysis and has greatly increased the expense of producing PSM.

The problem with alternating PSM is that the dark field/negative resist strategy does not perform well for non-dense line patterns and the light field/positive resist strategy creates unwanted opaque lines corresponding to the 0°/180° transitions in the mask.

Accordingly, in order to employ alternating PSM for isolated patterns, it is necessary to solve the problems with the light field/positive resist strategy and to develop a method for automatically creating compensation or trim masks for eliminating the effect of unwanted opaque lines which form along 0°/180° transitions.

SUMMARY OF THE INVENTION

It is an object of this invention to provide a method for improving the patterning of integrated circuits using light field photolithography with positive photoresists.

It is a still further object of the invention to simplify the design of phase shift masking for the gate level patterning of an integrated circuit which compensates for 0°/180° transition effects.

It is yet a still further object to provide a method to define a phase shift mask for the gate level patterning which provides phase shift elements to improve the dimensional control of the gate level pattern only in the integrated circuit region where the gate pattern overlays the active area pattern of the integrated circuit.

It is a still further object to provide a PSM method which enables maximally reduced gate patterns in the integrated circuit region where the gate pattern overlays the active area pattern of the integrated circuit.

It is a still further object to manufacture integrated circuits having better critical dimension control of the gate level pattern using the improved PSM methods of this invention.

It is a still further object to provide a process which automatically analyzes an IC logic circuit design and provides a digital file according to an accepted standard for manufacturing an alternating PSM for logic circuits.

DETAILED DESCRIPTION OF THE INVENTION

It generally believed by those skilled in PSM lithography that a mask employing a light field is not able to be automatically designed by computer for integrated circuit application in the design of alternating PSM layouts. Light field designs use opaque regions on the PSM mask to correspond to the location and shape of the conductive lines, typically doped low resistivity polysilicon, or tungsten silicide or the equivalent, to be formed on the resulting wafer and positive photoresist must be employed in combination with the light field mask. This light field design with PSM has a very significant advantage for logic gate layout in that it provides improved resolution in connection with isolated gates. However, it also has the disadvantage that dark lines form along every abutting 0°/180° region. To date, light field alternating PSM have needed to be designed by examining manually each PSM design and by either inserting a compensating phase shift transition region separating each 0° region from each 180° region or by manually designing a trim mask to be used in conjunction with a PSM which has no phase shift compensating regions.

To simplify and provide an automatic solution to the alternating PSM problem, I propose an approach for designing a light field alternating PSM which appears to work reliably for logic circuits and for reliably shrinking gate size for logic circuits. The underlying premise of my approach is to apply the alternating phase shifts only to those regions of the gate level PSM mask where the gate lines provided by a standard gate level pattern design would overlay the regions in which active semiconductor (N and P) are to be formed. In Boolian algebra, where X is a first function and Y is a second function, the common overlay region is called the intersection and is designated Z=X∩Y. (This is also called the "AND" function.) Hereinafter, the overlay region is designated the "Intersection."

Figure 1A:
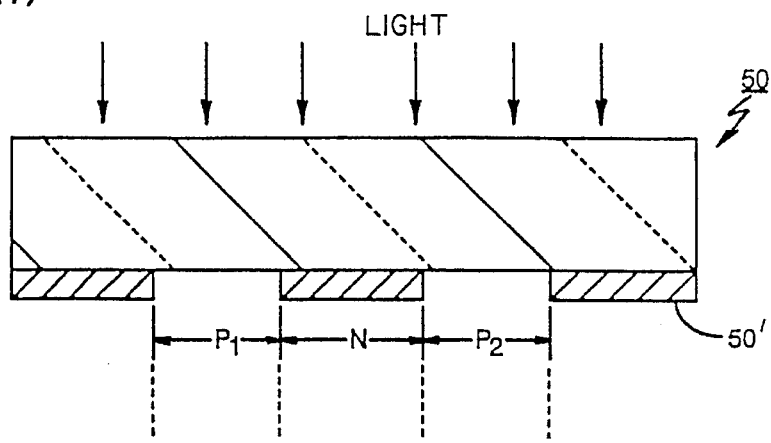
FIGS. 1(a) to 1(d) are schematic representation of diffraction effects using a prior art ordinary binary transmission mask in photolithography.
Figure 1B:
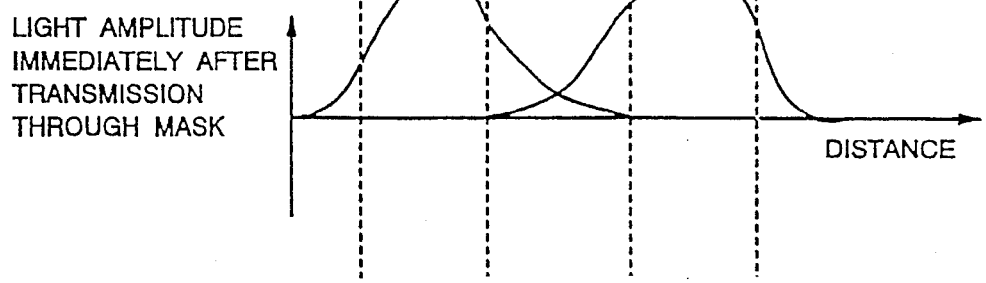
Figure 1C:
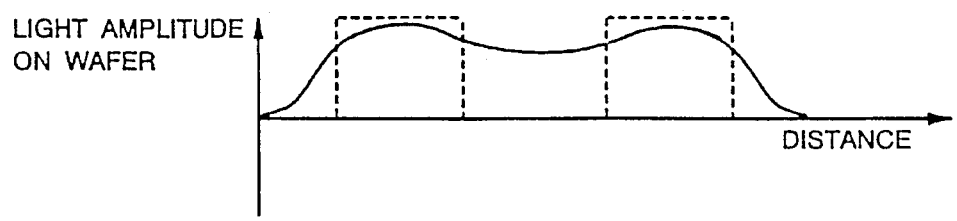
Figure 1D:
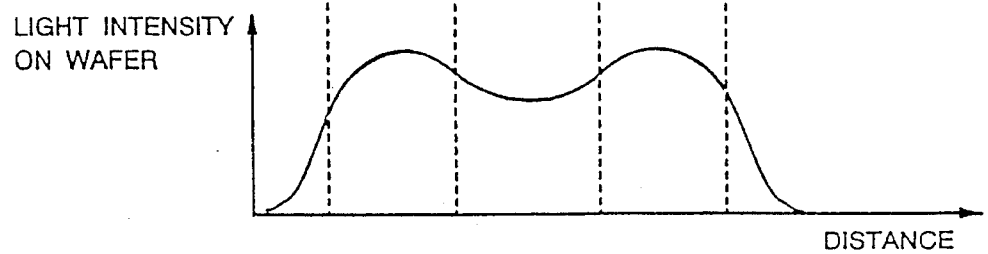
Figure 2A:
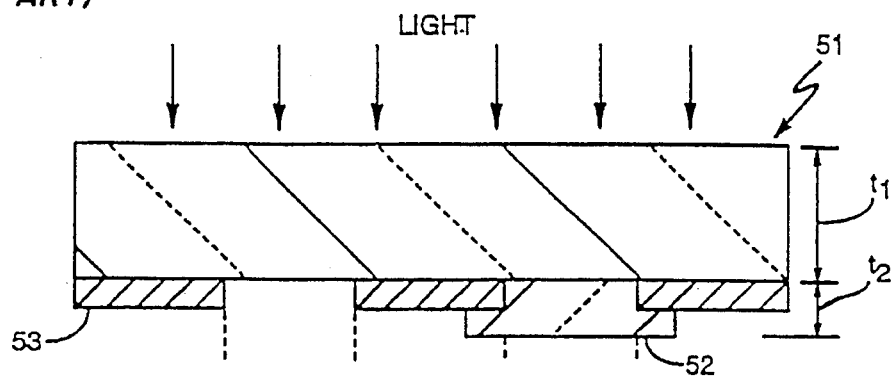
FIGS. 2(a) to 2(d) are schematic representation of diffraction effects and the use of prior art phase shift masking (PSM) to compensate for the effects of diffraction.
Figure 2B:
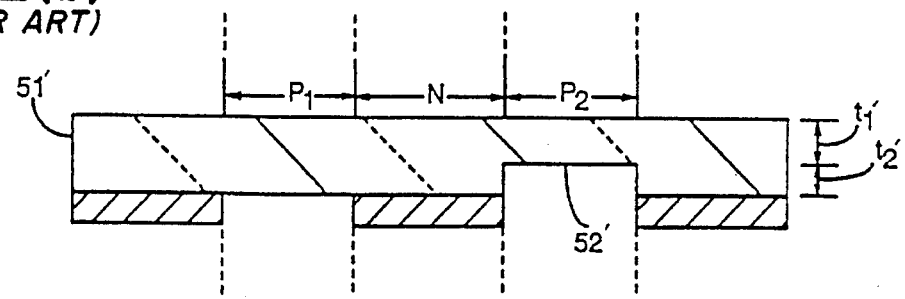
Figure 2C:
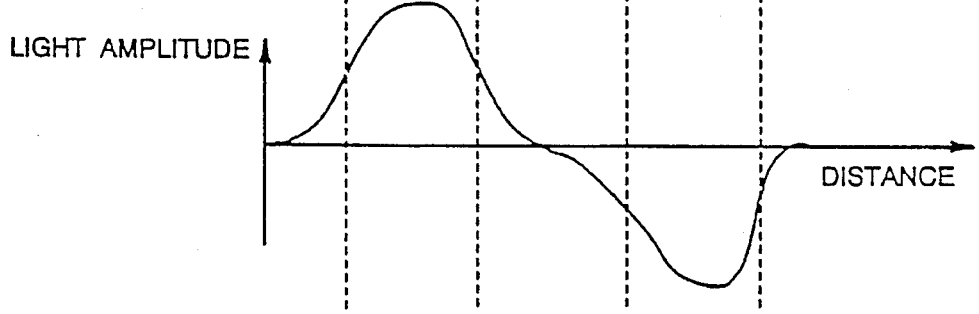
Figure 2D:
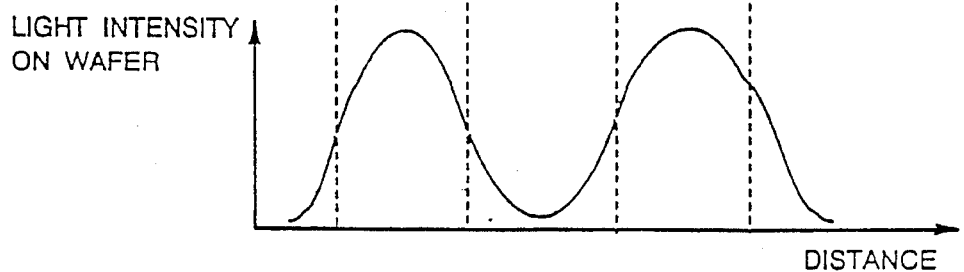
Figure 2E:
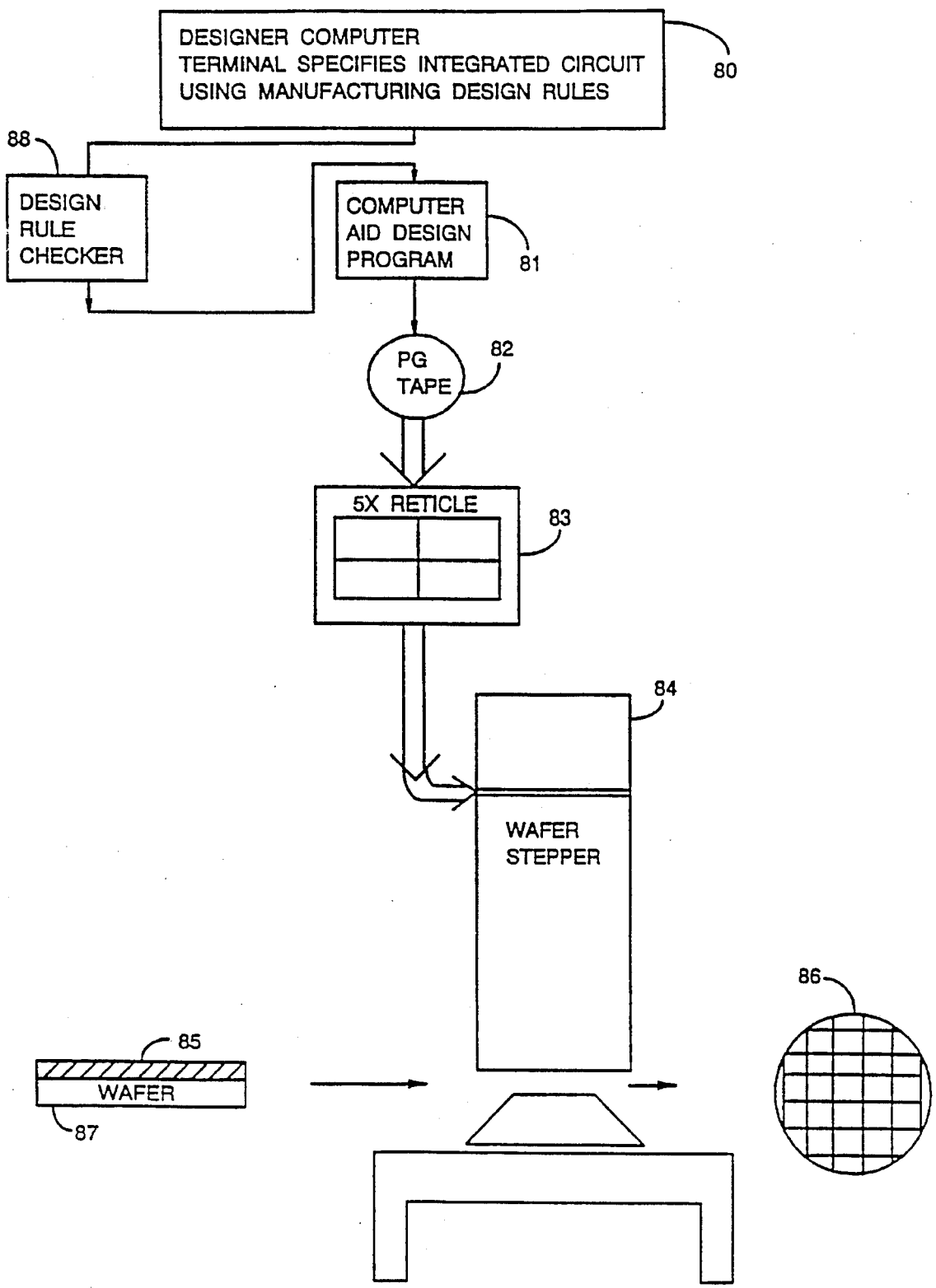
FIG. 2(e) is illustrative of the mask production and IC photolithographic production process.
Figure 3:
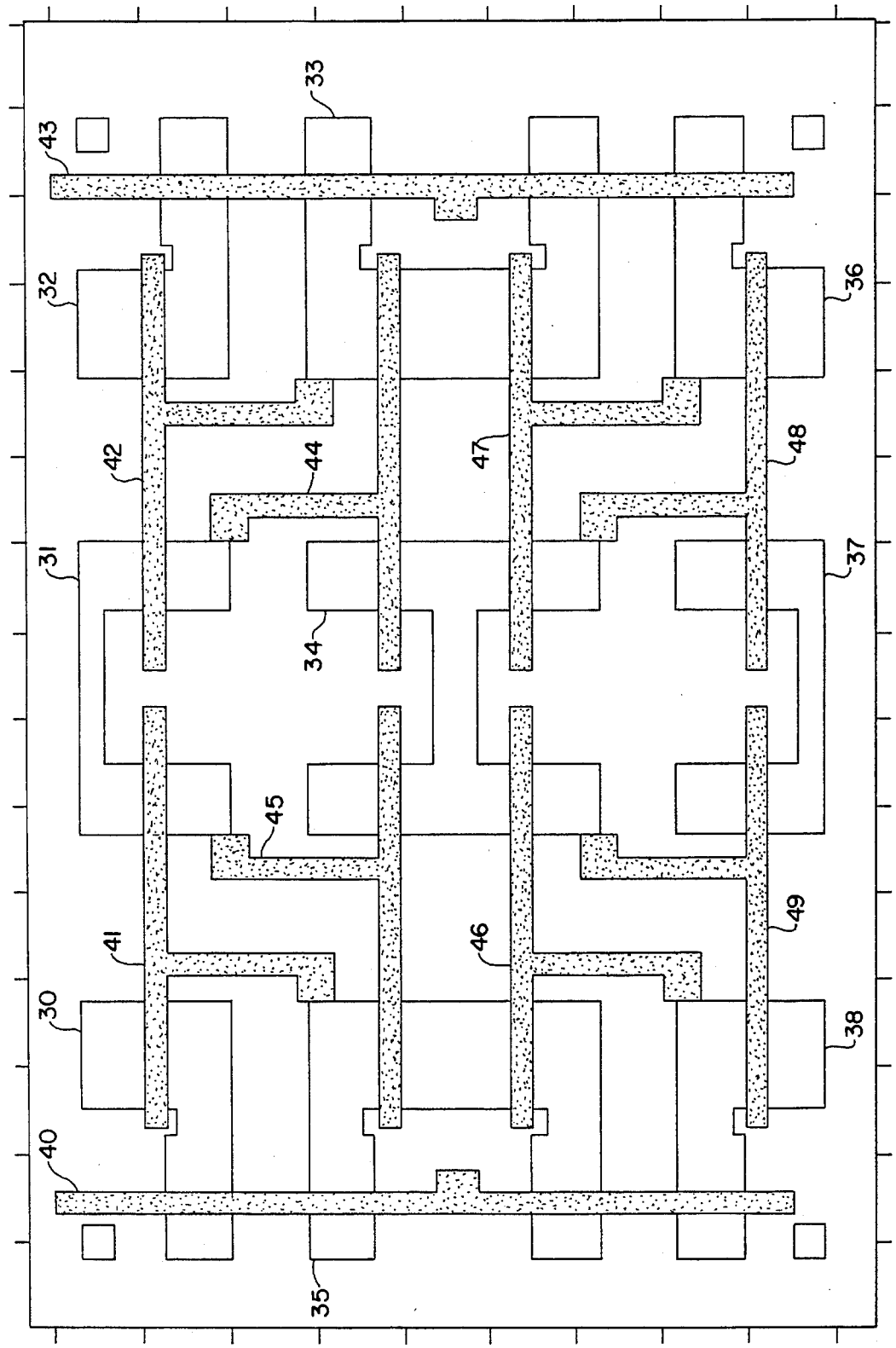
FIG. 3 is illustrative of a sample IC design showing the active areas (N and P) pattern and an overlay of the pattern of a gate level.

With reference to FIG. 3, there is shown, for purposes of illustration, a computer generated printout, in scale, of the aerial view of the layout of "doped" active regions, 30–38 of a circuit to be formed in the integrated circuit semiconductor wafer. Also shown in FIG. 3 overlaid on the active region layout, are computer generated solid black lines, representing the gate pattern, 40–49, called poly lines, which have been printed to the same scale as the active area and in this aerial view of FIG. 3 are positioned exactly as they would be positioned with respect to the active area on the target circuit. Assuming that the width dimensions of the poly lines of this design needs to be so narrow that optical diffraction effects would degrade the image of the mask if constructed by ordinary binary photolithography, then application of my invention method is needed to automatically make a alternating light field PSM and integrated circuits with such mask.

Figure 4:
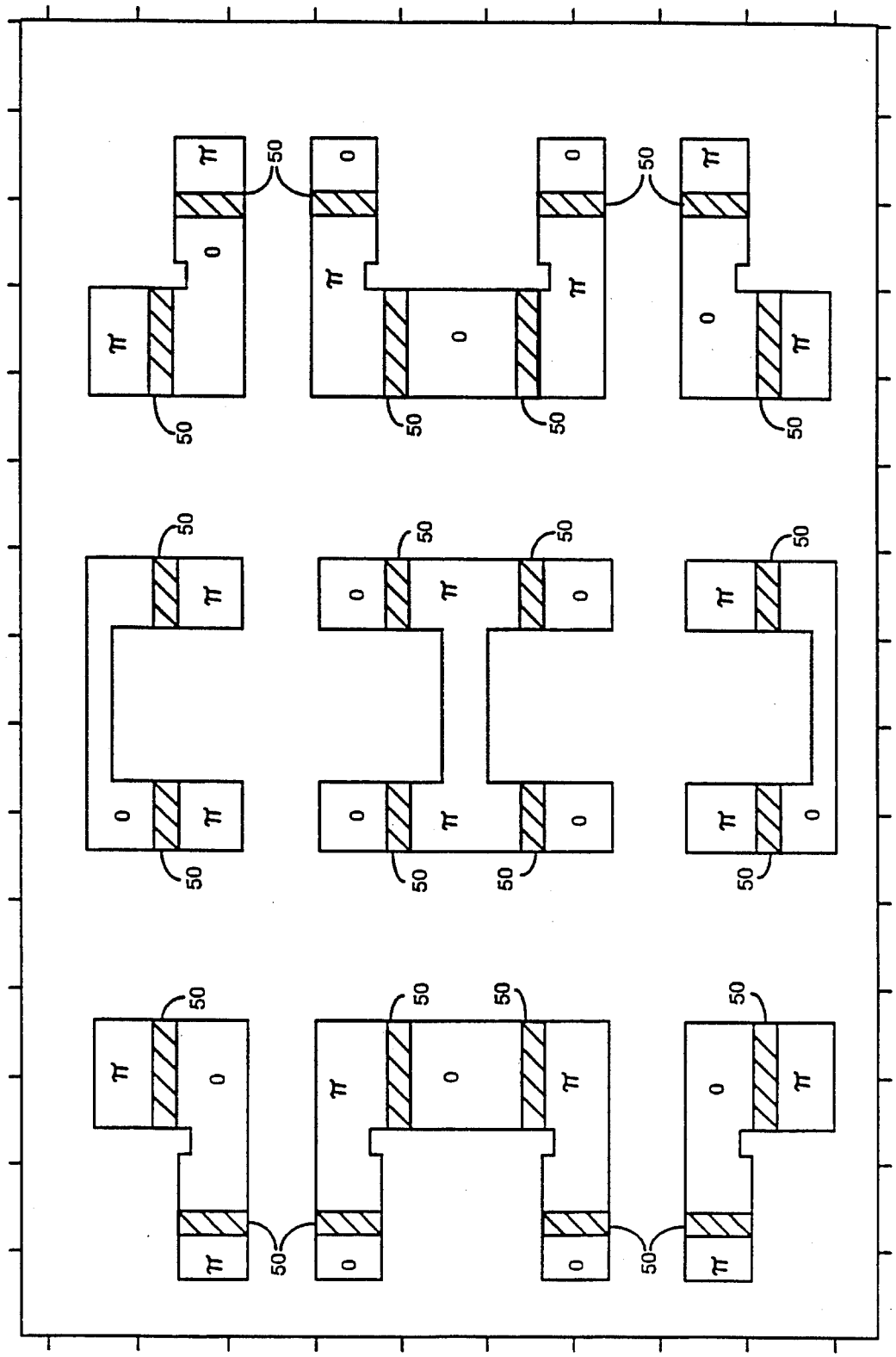
FIG. 4 is illustrative of the area of the Intersection of the active area and gate level including the designation of 0 degree and 180 degree phase shift regions according to this invention.

FIG. 4 contains hash marked areas 50 which represent the computer generated Intersection of the poly gate lines 40–49 of FIG. 3 and the semiconductor wafer active area regions 30–38 of FIG. 3. There are many ways to establish the Intersection plot. One approach is to have a computer perform the logical AND function, i.e. X.Y, pixel by pixel, where X is the active area spatial representation of FIG. 3 and Y is the gate level spatial pattern of FIG. 3. FIG. 4 also includes the outline region of the active area of FIG. 3. Next, the computer is employed to apply a scheme for automatically assigning zero degree and 180 degree regions on opposite sides of the Intersection. It is seen in FIG. 4 that the computer analyzes and then assigns a zero degree and a 180 degree region on opposite sides of each Intersection long dimension. There are constraints on the program for allocating phase selection for a given area: (1) every Intersection longer dimension must have a 0° and 180 ° border section; and (2) the 180 degree region and the zero degree region on each side of an Intersection along the longer dimension should have a minimum width $W_i$ and have an area around it which can be used as a compensation region. The compensation region should have width $W_c$. If the area between two Intersections is less than $(2W_i+W_c)$ then the area between the Intersections needs to be merged into a single phase 0° or 180° region.

Figure 5:
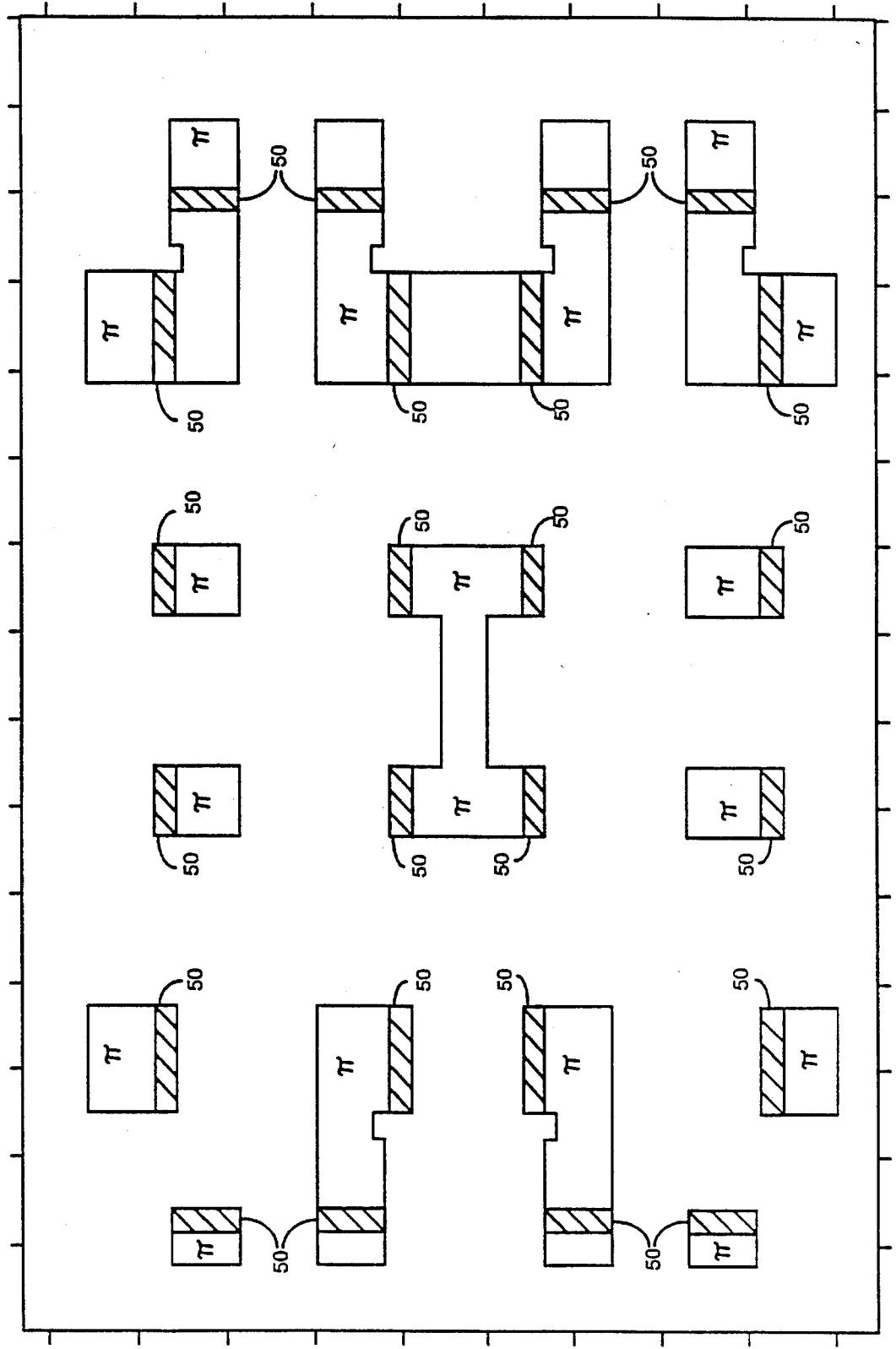
FIG. 5 is a redrawing of FIG. 4 illustrative of only the 180 degree phase shift regions of the sample design of FIG. 3.
Figure 6:
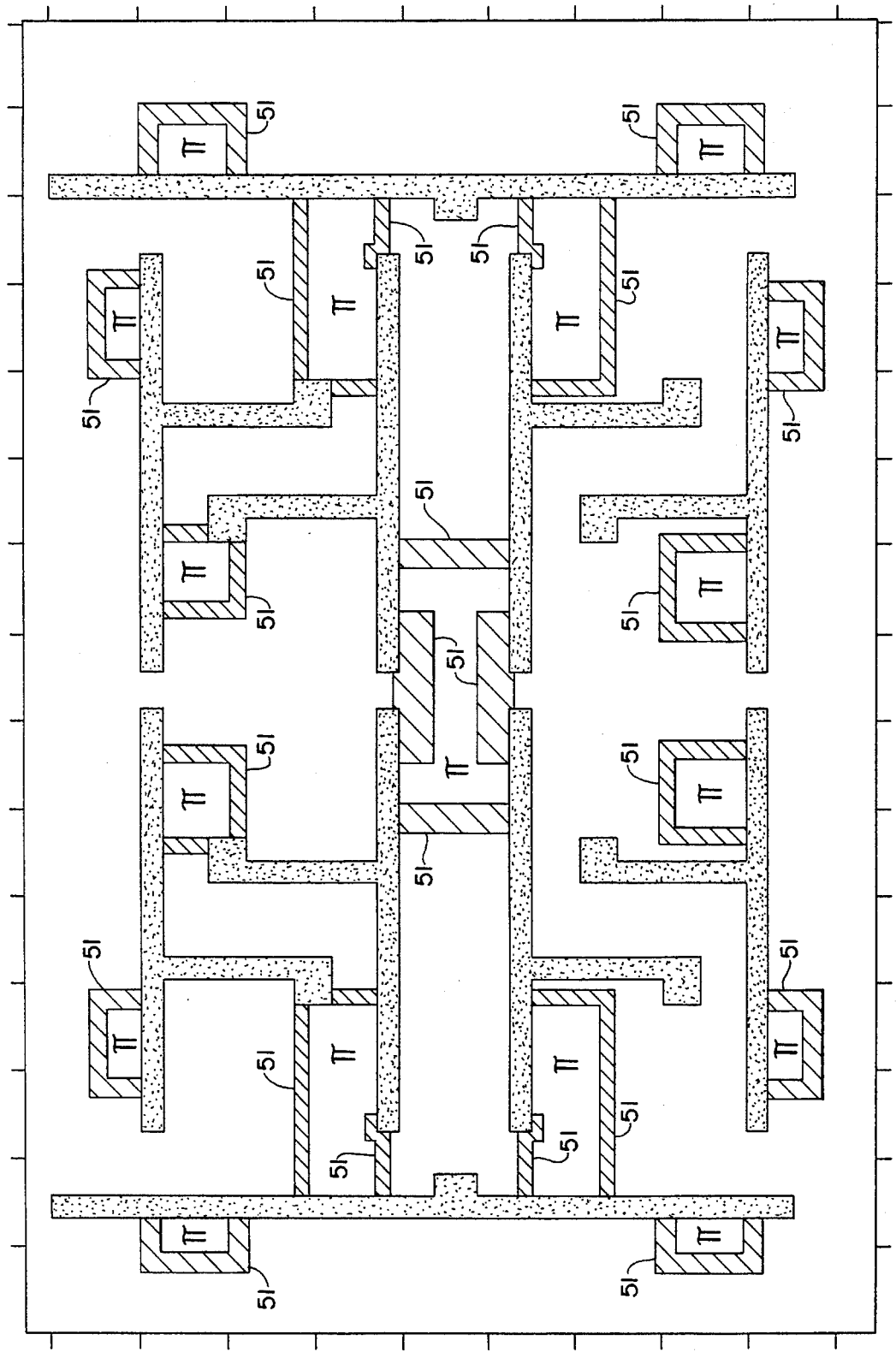
FIG. 6 is a version of a resulting PSM of the invention for the example of FIG. 3 showing gate contact opaque chrome lines and the transition compensation regions surrounding the 180 degree regions.

FIG. 4 is redrawn in FIG. 5 except that the outline of zero degree areas has been deleted so that the FIG. 5 labels only the π regions. The remaining region is assumed to be zero phase. However, as noted earlier, it is recalled that one of the problems with light field designs is that, unless compensated, a dark line is formed on the wafer which corresponds to the line where the 180° region abuts a 0° region. Accordingly, in FIG. 6, a region called the transition region 51 is shown formed between every 180° region and its adjoining zero degree region. The only portion of the periphery of the 180 degree region which are not interfaced by a transition region 51 is where the 180° region abuts the intersection regions 50. FIG. 6 also includes opaque line regions 41–49 which are overlaid on the compensated 180 degree regions, so that FIG. 6 is the aerial representation of one embodiment of the final computer generated light field alternating PSM for a single exposure to produce the gate level poly pattern depicted in FIG. 3. In a single exposure step, assuming a positive resist is employed on a wafer, if a PSM is manufactured according to FIG. 6 design, the gate layered circuit of FIG. 3 aerial view will be able to be produced.

Figure 7:
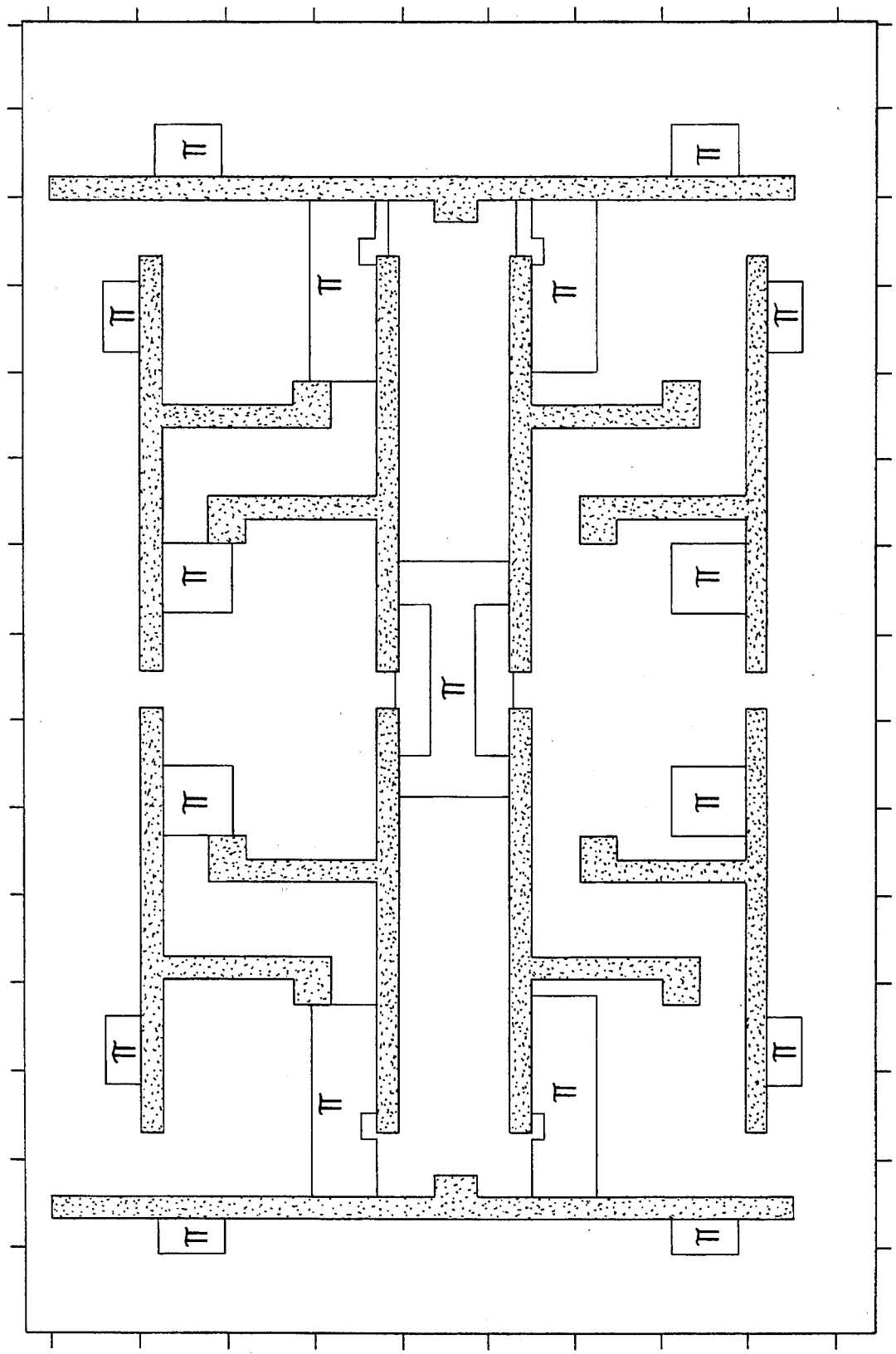
FIG. 7 is a version of alternative PSM for the example of FIG. 3 showing gate contact opaque chrome lines and the 180 degree regions without surrounding transition compensation regions.
Figure 8:
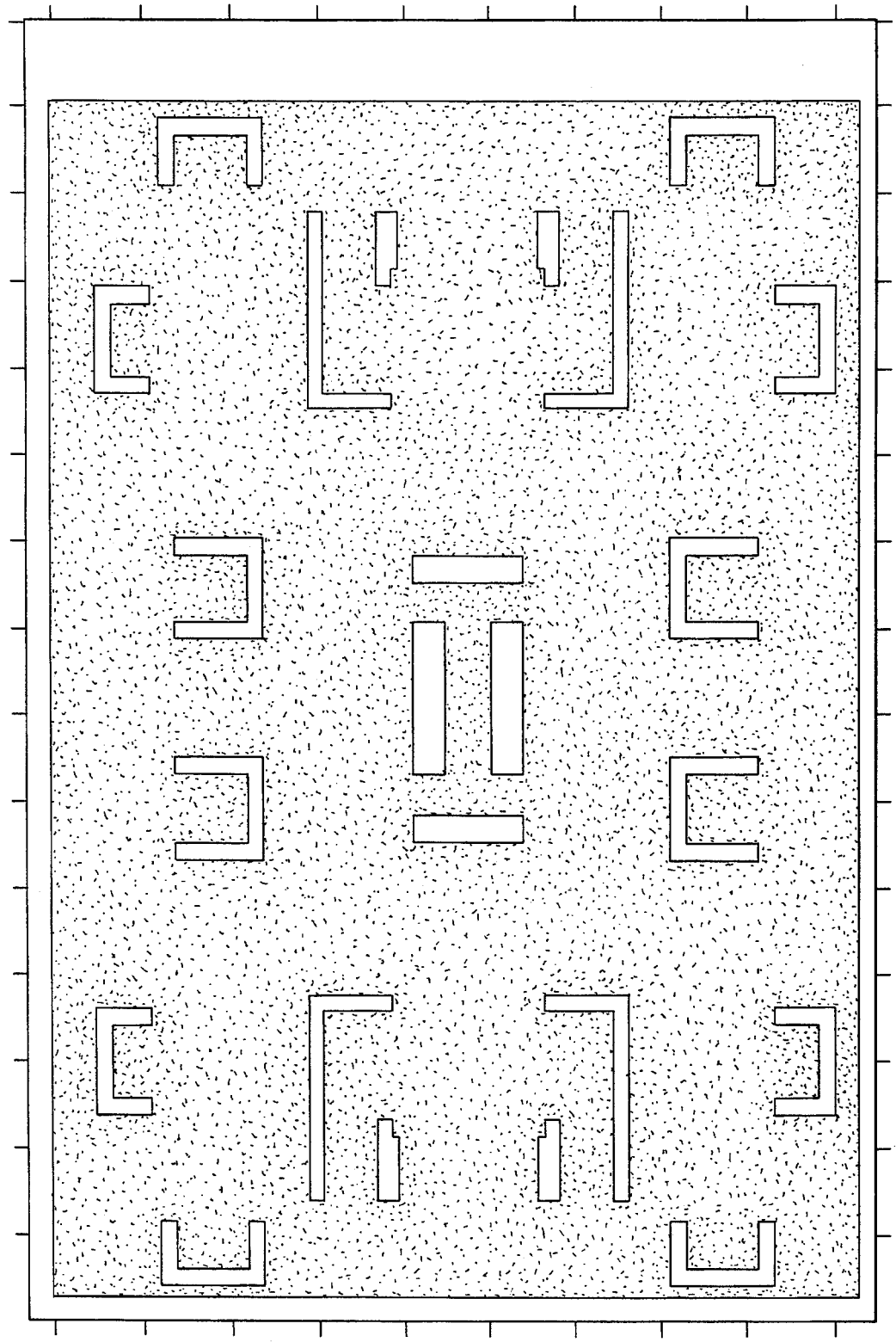
FIG. 8 is a version of trim mask for use following exposure by the mask of FIG. 7 to avoid lines caused by 0°/180° transition.
Figure 9A:
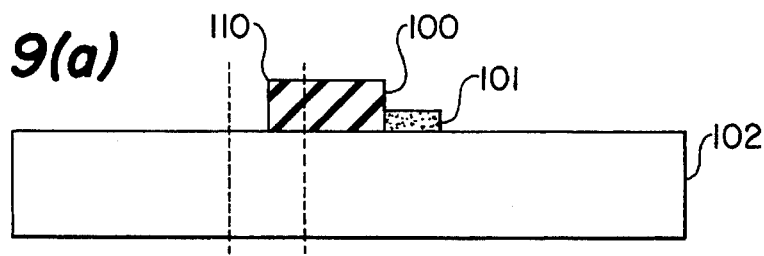
FIGS. 9(a) to 9(c) are cross sections illustrative of the alignment of a trim mask transparent aperture center line with the abutting line of the 0°/180° regions of the non-transition compensated mask of FIG. 8.
Figure 9B:
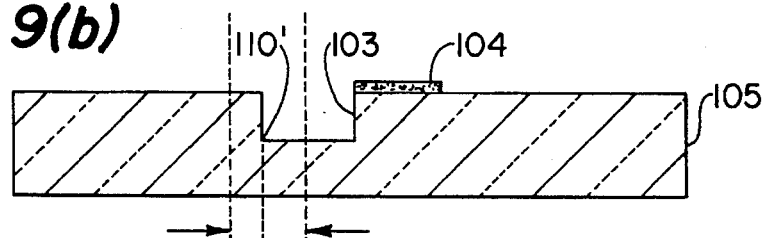
Figure 9C:
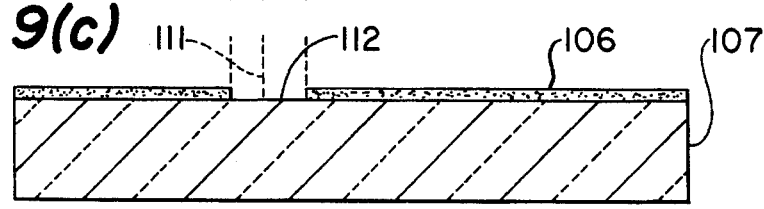

Alternatively, a two step exposure method can also accomplish the gate level poly patterns depicted in FIG. 3. FIG. 7 is identical to FIG. 6 but without any compensating transition region surrounding each 180 degree region. As noted, when exposing in a first step the positive photoresist on the wafer with a light field PSM of the form of FIG. 7, dark lines will be imaged along the line where 180° regions abut 0° regions. These unwanted dark lines can then be removed by a second exposure of the wafer through the "trim" mask of FIG. 8, provided no development is carried until completion of both exposure steps. The trim mask is transmissive along every 0/180 degree region abutting line so that the second exposure of the positive photoresist results in exposure and hence removal of the dark lines during resist development. FIGS. 9(a)–9(c) are further explanatory of one embodiment of the alignment and construction of a trim mask. FIG. 9(a) is a cross section of a deposited 180 degree phase shift region 100 which has an abutting transition line 110 between the 180 degree region and the zero degree region, 102. In FIG. 9(b) an etched shifter 105 is illustrated and the transition 110' between the zero and 180 degree region also is shown. A trim mask 107 for the shifter masks of FIG. 9(a) and 9(b) is shown in FIG. 9(c). The trim mask 107 is aligned so that the center 111 of the transmission region 112 is aligned with the transition or 110'. The UV light which transmits through the trim mask falls on the positive photoresist and exposes that region so that it will be removed during development of the resist. (It is noted that it is understood by those skilled in the art that following resist development, the non-exposed photoresist remains in place over the top of the region to be retained. Since the photoresist is over the top of a polysilicon or metal layer, after the resist is removed and the wafer is etched, the remaining resist protects the lines beneath it so that the uncovered poly (metal) on the wafer surface is removed, leaving the desired gate contact pattern.

With reference to FIG. 11(a) and FIGS. 12(a)–12(d), a compensation transition region 51 configuration embodiment is depicted. The transition region 51 can be constructed of step regions, preferably two or more step regions, such as 120 degrees (71) and 60 degree (70) interposed between the n region and the zero degree region. A single π/2 step region may also work in some instances. Physically, these stepped phase transition regions should have a minimum width 0.2 λ/NA, where λ is exposure wavelengths and NA is numerical aperture of the stepper and can be configured according to FIG. 12(a) for a deposited shifter or 12(b) for an etched shifter. Alternatively, the transition region can also have more steps or be a graded transition according to 12(c) or 12(d) for deposited or etched PSM respectively.

Figure 11A:
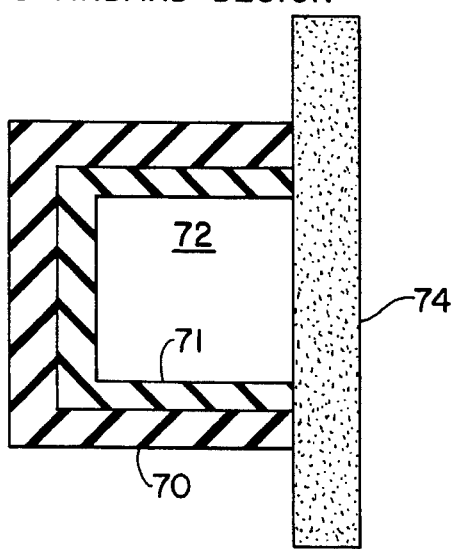
FIGS. 11(a) and 11(b) illustrate the standard gate metal design and the reduced gate design respectively.
Figure 11B:
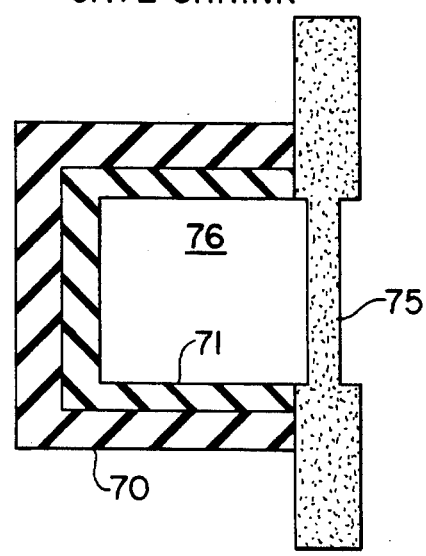

FIG. 11(b) discloses a further embodiment of the PSM gate level design method. I have determined that it is possible to employ the dark natural line formed at the Intersection which coincides with the abutting of the 180/0 degree regions to create the narrowest possible gate. For example, using a stepper with a numerical aperture of 0.5, a partial coherence factor 0.5 for the light source, and an exposure wavelength of 365 nm, and an alternating PSM, this minimum gate was 0.2 microns. As shown in FIG. 11(b), as another alternative, I provide a very narrow opaque line, 75 on the mask as shown which would overlay the 0/180 degree natural dark abutting transition. This narrow opaque line is very slightly narrower than the natural width of 0.2 microns, such as 0.18 microns or whatever increment is required to provide reliability in manufacturing yield.

This narrow opaque line is desirable for three reasons: 1) by concealing the phase edge it reduces the displacement of the wafer image caused by misalignment of the phase shift layer to the opaque layer on the mask; 2) it reduces line width error at the abutting 180/0° transition caused by misalignments of phase layers where a multiple phase step method is used; and 3) the opaque line, typically chromium, provides a more robust mask to etching than the photoresist, providing a steeper etched profile.

The natural line width for a stepper is defined as 0.25* λ/NA; where λ is the excitation wavelength and NA is numerical appeture.

Figure 10:
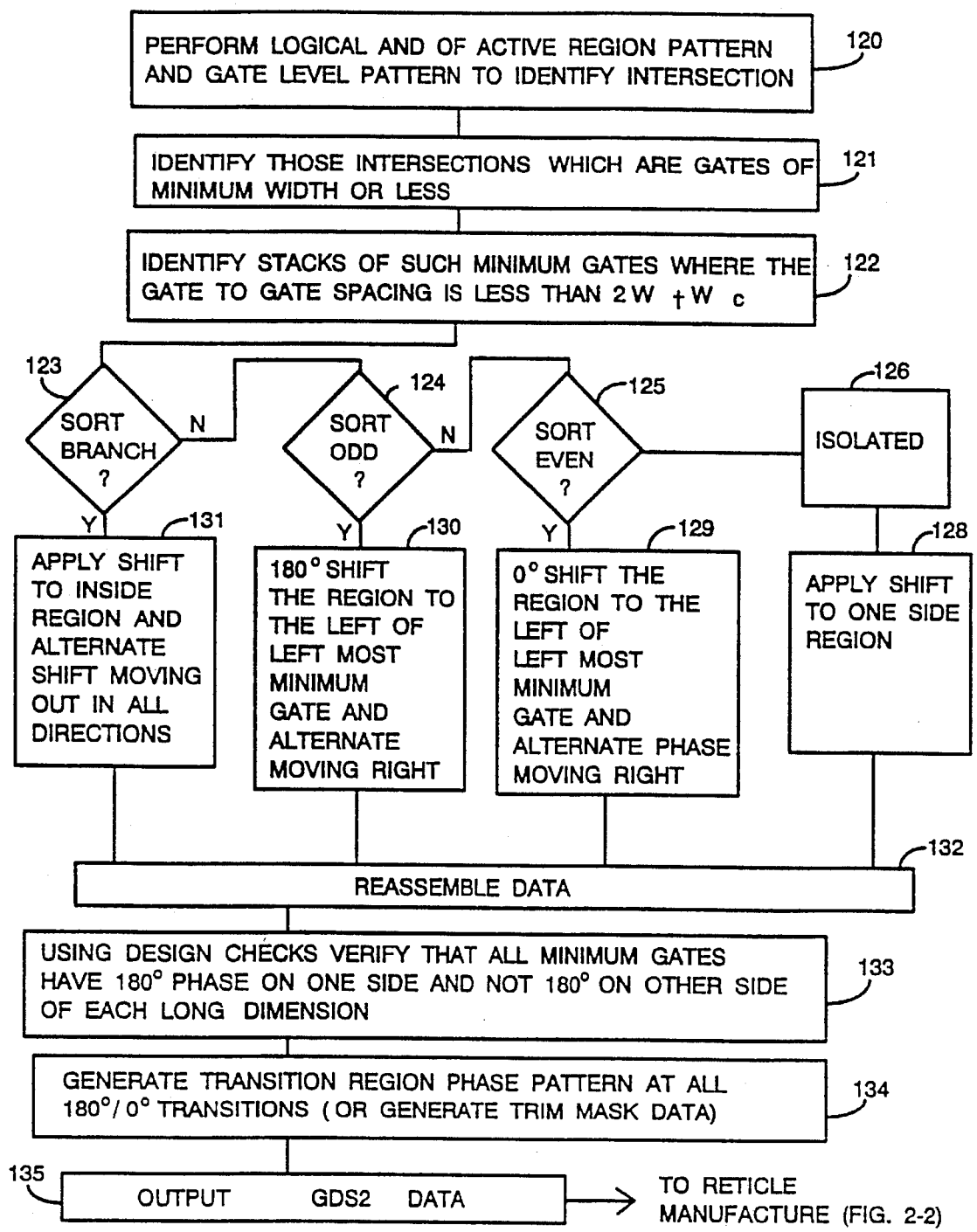
FIG. 10 is a flow diagram for the procedure to manufacture an alternating PSM with compensating transition regions and reduced gate lengths and to perform photolithography using said alternating light field PSM and positive photoresist.
Figure 12A:
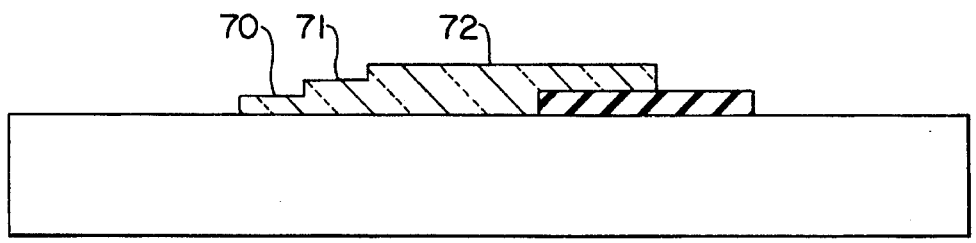
FIGS. 12(a) to 12(d) are illustrative of several configurations of transition compensation region shifter embodiments.
Figure 12B:
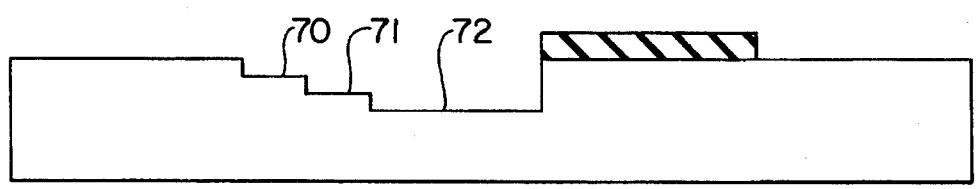
Figure 12C:
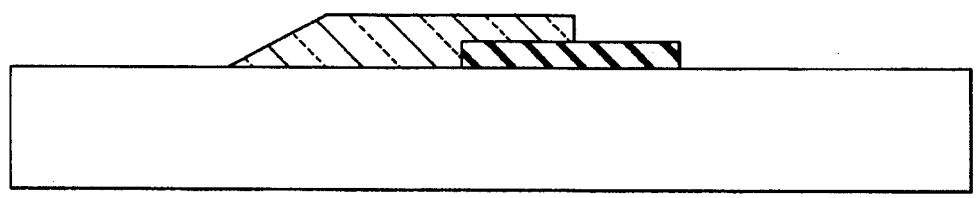
Figure 12D:
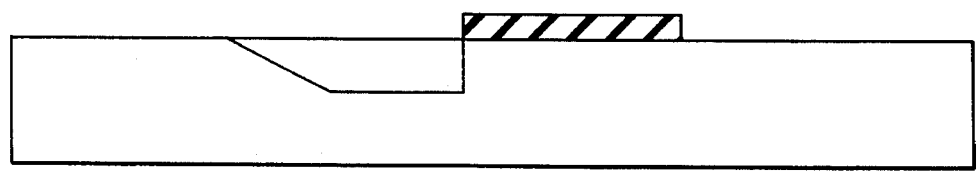

The procedure described above is more fully illustrated in the flow diagram of FIG. 10. Specifically, block 120 depicts the AND operation to determine the Intersection of the active area pattern and poly gate contract pattern. Next, in block 121, all gates which are narrower than the minimum width achievable without phase shift masking are identified. Block 122, depicts a subclassification step which identifies groupings of minimum width gates which are contiguous and where the gate to gate spacing is too close for transition regions, i.e. less than $2W_i+W_c$. These groupings are called "stacks". Gates which are not in a stack are classified as isolated gates 126. Next, the "stacks" identified in block 122 are further subclassified into branch, 123, odd 124, or even 125 stacks.

The odd stacks are groups in which an odd number of minimum gate intersections occur on a common active area bordered by a spacing on both sides which is large enough for a transition region. In block 130, these odd stack regions are to be phase shifted by applying 180° phase shift to the left most region and then progressively alternating the phase from 180° to 0° and 0° to 180° for regions between gates progressively from left to right.

In block 125, the even stack regions are groups where an even number of intersections occur on a common active area bordered by a spacing large enough for a transition region. The strategy here is to apply 0° phase shift to the left most region and progressively alternating the phase from 0° to 180° to 0° for regions between gates progressively from left to right.

For isolated regions 126, one side of the gate is to provided with a transition compensation region, i.e. graduated or steps of phases to eliminate the formation of an unwanted line.

Branch regions are regions in which parts of a single active region is bordered by more than two minimum gates. This contrasts to the odd and even stack. The shift strategy for such branch stack regions is to select one phase, either 180° or 0°, for the central region having more than two Intersections, and then working outward in all directions, alternating phase as one crosses each gate.

In block 132, the data for each type of stack and for isolated gates is reassembled and then verified by the Design Rule Checker 133 to confirm and verify that all minimum gates have 180° or 0° phase one side and not on the other side of each long dimension.

In block 134, the transition regions are generated for every location where 180°/0° regions abut such as at the short side of a gate and at the edge of a stack. Alternatively, as depicted earlier, the transitions could be replaced by a separate trim mask for which the data is now generated.

Finally, the output data called GDS2 is created for the mask generation. The FRACT software module of the Dracula program supplied by Cadence Design System will create GDS2 in the MEBES standard file format for an e-beam mask writer. For phase shifting type masks, data for more than one layer are output to create the poly reticle and the FRACT module will create the tape output containing all the layers required to create the phase shift mask and the trim mask if this alternative is elected.

The positive photoresist used in this invention are available commercially under numerous tradenames. The invention is not limited to these currently used resists.

The reticles typically are made from amorphous silicon dioxide, i.e. synthetic quartz, and the opaque material is typically chrome. Any opaque material could theoretically be used in place of chrome for this invention and the invention is not dependent on the specific material employed.

The figures of this document depict embodiments of this invention and are not intended to limit the scope of the invention. The scope of claims shall be construed in accordance with the claims. With this in view,

What is claimed is:

1. In an i-line stepper lithography method for phase shift mask patterning for forming the levels of an integrated circuit (IC) on a semiconductor wafer, said lithography method including use of different masks to pattern the layout of different levels, one such level being the gate level and a second such level being the active regions, said active regions being spatially defined by an active region layout pattern, said gate level being spatially defined by a gate level pattern having first and second gate level layout portion, said first gate level layout portion being a standard non-phase shift mask pattern having opaque and non-opaque regions and said second gate level layout portion having areas containing phase shift regions, said method comprising:

performing a comparative analysis of said active regions layout pattern and said first gate level layout portion to spatially establish the location of Intersection regions corresponding to the regions on the IC where said active region layout pattern and said first gate level layout portion overlay, said Intersection regions being rectangles having a pair of parallel long sides and a pair of parallel short sides;

constructing a transmissive light field phase shift mask (PSM) having various phase shifted regions and opaque regions for patterning said gate level, said PSM comprising said gate level layout pattern, said gate level layout pattern being identical to said first gate level layout portion except in the regions on said PSM corresponding to said Intersection regions, said gate level layout pattern including zero degree phase shift regions which are contiguous with one said side of each said pair of parallel long sides of said regions corresponding to Intersection regions and a 180 degree phase shift region contiguous with each of the other side of said pair of parallel long sides of said regions corresponding to said Intersection regions, said opaque pattern of said transmissive light field PSM corresponding to said Intersection regions and to said opaque regions of said first gate level layout portion; and aligning said PSM in said i-line stepper and exposing a positive resist on said wafer with a light source directed through said transmissive light field PSM by focussing with said lens system the said light which transmits through said PSM onto said positive resist on said wafer.

2. The method of claim 1 further comprising:

providing on said phase shift mask a compensating transition phase shift region around and contiguous to said 180 degree phase shift regions and between said 180 degree phase shift regions and said zero phase regions, said compensating transition phase shift region being contiguous with the entire periphery of said 180 degree phase area except for the region where said 180 degree phase area overlaps a region having said opaque pattern thereon.

3. The method of claim 2 wherein said compensating transition phase shift region comprises a first region of 60 degrees shift and a second region of 120 degrees shift where said 120 degree region is intermediate between said sixty degree region and said 180 degree region.

4. The method of claim 2 wherein said gate level layout pattern includes a first area having a first gate length and a second area having a second gate length wherein said first gate length area is shorter than said second gate length area and wherein said first gate length is the width of said Intersection regions covered by said first area.

5. The method of claim 2 wherein said compensating transition phase region includes a linearly graded transition.

6. The method of claim 2 wherein said 180 degree shift regions are layered regions of said PSM providing a lagging phase of said light which transmits through said 180 degree phase shift region relative to the phase of said light which does not pass through said 180° phase shift region.

7. The method of claim 1 including the step of constructing a trim mask having a dark field surrounding a transmission pattern, said transmission pattern being a pattern having a center line which exactly corresponds to the locus of some of transitions between a zero degree to 180 degree regions; and before developing said exposed positive resist, again exposing said positive resist on said integrated circuit with a partially coherent light source directed through said trim mask which trim mask has been aligned so that the zero to 180 degree locus of said trim mask is aligned with said 0°/180° transitions regions exposed during said first exposure; and developing said resist.

8. The method of claim 2 wherein said 180 degree phase shift regions are etched regions of said PSM providing a leading phase of said light which transmits through said 180 degree phase shift region relative to the phase of said light which does not pass through said 180° phase shift region.

9. The method of claim 8 including the step of constructing a trim mask having a dark field surrounding a transmission pattern, said transmission pattern being a pattern having a center line which exactly corresponds to the locus of some of the transitions between zero degree to 180 degree regions; and before developing said exposed positive resist, again exposing said positive resist on said integrated circuit with a partially coherent light source directed through said trim mask which trim mask has been aligned so that the zero to 180 degree locus of said trim mask is aligned with said 0°/180° transitions regions exposed during said first exposure; and developing said resist.

10. The method of claim 2 wherein the step of providing on said phase shift mask a compensation transition phase shift region around and contiguous to said 180 degree phase shift regions includes the step of determining a physical distance between adjoining 180 degree phase shift regions and combining adjoining 180 degree phase shift regions together if the said physical distance is less than the minimum distance required to provide said transition phase shift region around each said 180 degree phase shift region.

11. The method of claim 1 including the step of constructing a trim mask having a transmission pattern for passing light from said light source, said trim mask having a dark field completely surrounding said transmission pattern, said transmission pattern being a pattern having lines of width T having a center line, where the locus of said center line exactly corresponds to the locus of all edges where 0 degree regions abut to 180 degree regions on said gate level layout pattern and where T is greater than the natural line width of the stepper; and after said exposing step but before developing said exposed positive resist layer, replacing said PSM with said trim mask and exposing again said positive resist layer on said integrated circuit with said partially coherent light source directed through said trim mask and optics wherein said trim mask has been aligned so that said center edges said transmission patterns of said trim mask are aligned with said locus of the line of where 0 degree and 180 degree regions abutted during said first exposure; and developing said resist layer.

* * * * *